(12) United States Patent
Matsumura

(10) Patent No.: US 11,222,068 B2
(45) Date of Patent: Jan. 11, 2022

(54) INFORMATION PROCESSING DEVICE, INFORMATION PROCESSING METHOD, AND DATA STRUCTURE

(71) Applicant: FUJITSU LIMITED, Kawasaki (JP)

(72) Inventor: Hidetoshi Matsumura, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 209 days.

(21) Appl. No.: 16/574,127

(22) Filed: Sep. 18, 2019

(65) Prior Publication Data

US 2020/0012685 A1 Jan. 9, 2020

Related U.S. Application Data

(63) Continuation of application No. PCT/JP2018/006038, filed on Feb. 20, 2018.

(30) Foreign Application Priority Data

Apr. 20, 2017 (JP) .............................. JP2017-083747

(51) Int. Cl.
*G06F 16/901* (2019.01)
*G06F 16/25* (2019.01)

(52) U.S. Cl.
CPC ........ *G06F 16/9014* (2019.01); *G06F 16/258* (2019.01)

(58) Field of Classification Search
CPC ............................ G06F 16/9014; G06F 16/258
See application file for complete search history.

(56) References Cited

U.S. PATENT DOCUMENTS

2007/0096953 A1 5/2007 Odagiri
2020/0034367 A1* 1/2020 Iwasaki ............... G06F 16/2465

FOREIGN PATENT DOCUMENTS

| EP | 1607868 A1 | 12/2005 |
| JP | H07-288475 A | 10/1995 |
| JP | H09-36747 A | 2/1997 |
| JP | 2007-124561 A | 5/2007 |
| JP | 2012-164130 A | 8/2012 |
| WO | 2004/081794 A1 | 9/2004 |

OTHER PUBLICATIONS

International Search Report and Written Opinion of the International Searching Authority (Form PCT/ISA/210, 220, and 237), mailed in connection with PCT/JP2018/006038 dated Apr. 3, 2018 (8 pages).

* cited by examiner

*Primary Examiner* — Truong V Vo
(74) *Attorney, Agent, or Firm* — Fujitsu Patent Center

(57) ABSTRACT

An information processing device includes: a memory; and a processor coupled to the memory and configured to: convert target data into first data by predetermined arithmetic processing; generate second data based on the converted first data and identification information which specifies a file of the target data; and store the target data in an address of a memory corresponding to the generated second data.

11 Claims, 10 Drawing Sheets

FIG. 3

| CHARACTER STRING | HASH VALUE | ADDRESS | | | |
|---|---|---|---|---|---|
| | | FILE ID 0 | FILE ID 1 | FILE ID 2 | FILE ID 3 |
| CHARACTER STRING 0-0 ⋮ CHARACTER STRING 0-M0 | 0 | 0 | 1 | 2 | 3 |
| CHARACTER STRING 1-0 ⋮ CHARACTER STRING 1-M1 | 1 | 1 | 2 | 3 | 0 |
| CHARACTER STRING 2-0 ⋮ CHARACTER STRING 2-M2 | 2 | 2 | 3 | 0 | 1 |
| CHARACTER STRING 3-0 ⋮ CHARACTER STRING 3-M3 | 3 | 3 | 0 | 1 | 2 |

INFORMATION PROCESSING DEVICE, INFORMATION PROCESSING METHOD, AND DATA STRUCTURE

CROSS-REFERENCE TO RELATED APPLICATION

This application is a continuation application of International Application PCT/JP2018/006038 filed on Feb. 20, 2018 and designated the U.S., the entire contents of which are incorporated herein by reference. The International Application PCT/JP2018/006038 is based upon and claims the benefit of priority of the prior Japanese Patent Application No. 2017-083747, filed on Apr. 20, 2017, the entire contents of which are incorporated herein by reference.

FIELD

The embodiment discussed herein is related to an information processing device, a program, an information processing method, and a data structure.

BACKGROUND

There are systems or the like to improve average data throughput.

Japanese Laid-open Patent Publication No. 7-288475 and Japanese Laid-open Patent Publication No. 9-36747 are disclosed as related art.

SUMMARY

According to an aspect of the embodiments, an information processing device includes: a memory; and a processor coupled to the memory and configured to: convert target data into first data by predetermined arithmetic processing; generate second data based on the converted first data and identification information which specifies a file of the target data; and store the target data in an address of a memory corresponding to the generated second data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is an explanatory diagram illustrating an address generation method;

DESCRIPTION OF EMBODIMENTS

For example, by increasing the dictionary reset operation speed of a dictionary-based data compression engine, average data throughput may be improved.

For example, a circuit scale may be enlarged.

In an aspect, an information processing device or the like capable of suppressing enlargement of circuit scale may be provided.

First Embodiment

Figure 1:
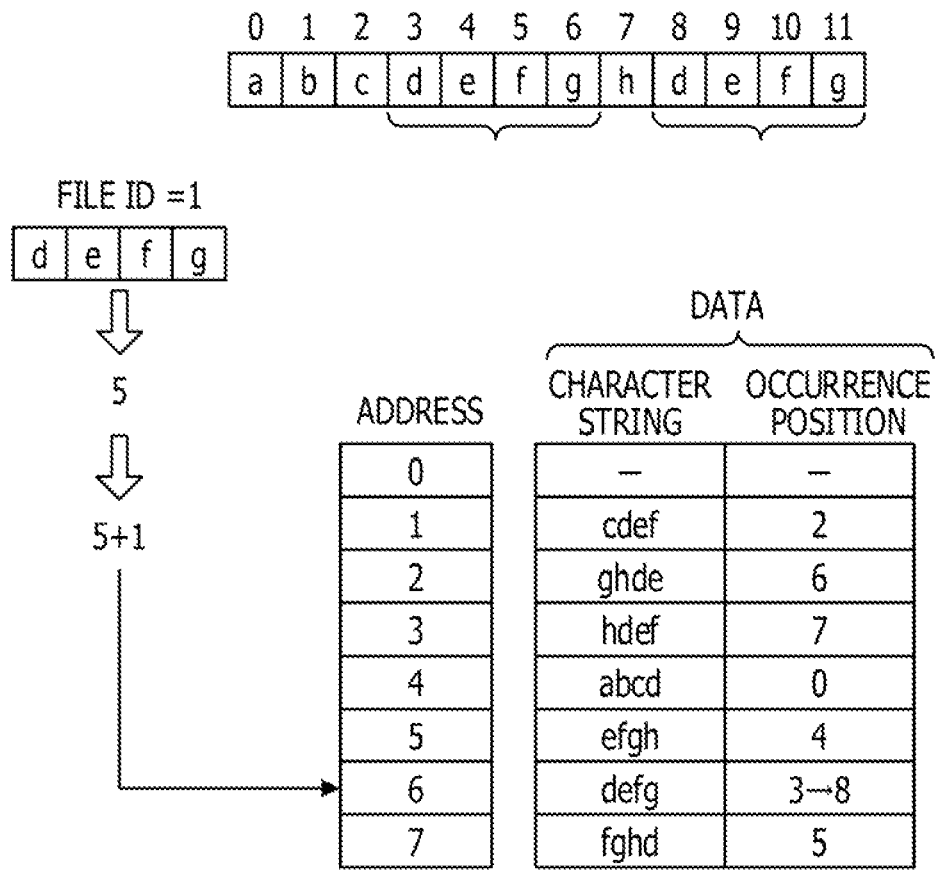
FIG. 1 is an explanatory diagram illustrating an outline of an information processing system.
Figure 1:
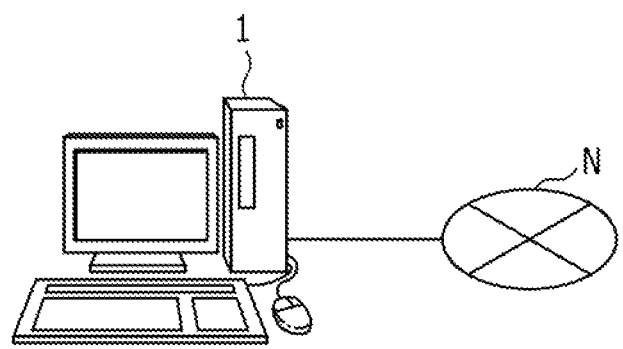

Hereinafter, embodiments will be described with reference to the drawings. FIG. 1 is an explanatory diagram illustrating an outline of an information processing system. The information processing system includes an information processing device 1 or the like connected to a network N including the Internet, a local area network (LAN), or a public switched telephone network.

The information processing device 1 is a device that compresses compression target data. Examples of the information processing device 1 include a server computer, a personal computer, or large-scale integration (LSI) of an application specific integrated circuit (ASIC) or a field-programmable gate array (FPGA).

Hereinafter, the information processing device 1 will also be described as a computer 1. Furthermore, the processing described below may be implemented by either software or hardware. An example of implementing the processing by software is illustrated in the present embodiment, while an example implemented by hardware is illustrated in other embodiments.

FIG. 1 illustrates an example of compression target data in a file. The data includes a character string such as a, b, c, d, e, f, g, h, d, e, f, g, or the like. Numbers 0, 1, 2, . . . attached to each of pieces of data are assigned in order every one byte from the head of the data, and represent position information (hereinafter referred to as an occurrence position) for specifying the position of the data in the file. Identification information (hereinafter referred to as file ID) for specifying a file is given to the file. The file ID is 1 in the example of FIG. 1. Here, when the character string defg of occurrence positions 3 to 6 is to be stored in memory as compression target data, first data "5" is calculated by predetermined arithmetic processing.

Next, a value based on file ID "1" is added to the first data to obtain second data "6". Subsequently, the character string defg and the occurrence position 3 are to be stored at address "6" of the memory corresponding to the second data "6". Similarly, in a case where the character string defg at occurrence positions 8 to 11 is to be stored as target data, the first data "5" is calculated by the predetermined arithmetic processing described above. Next, a value based on file ID "1" is added to the first data to obtain second data "6". Since the character string defg is already stored in the memory corresponding to the second data "6", the occurrence position 3 is overwritten with the occurrence position 8. Details will be described below.

Figure 2:
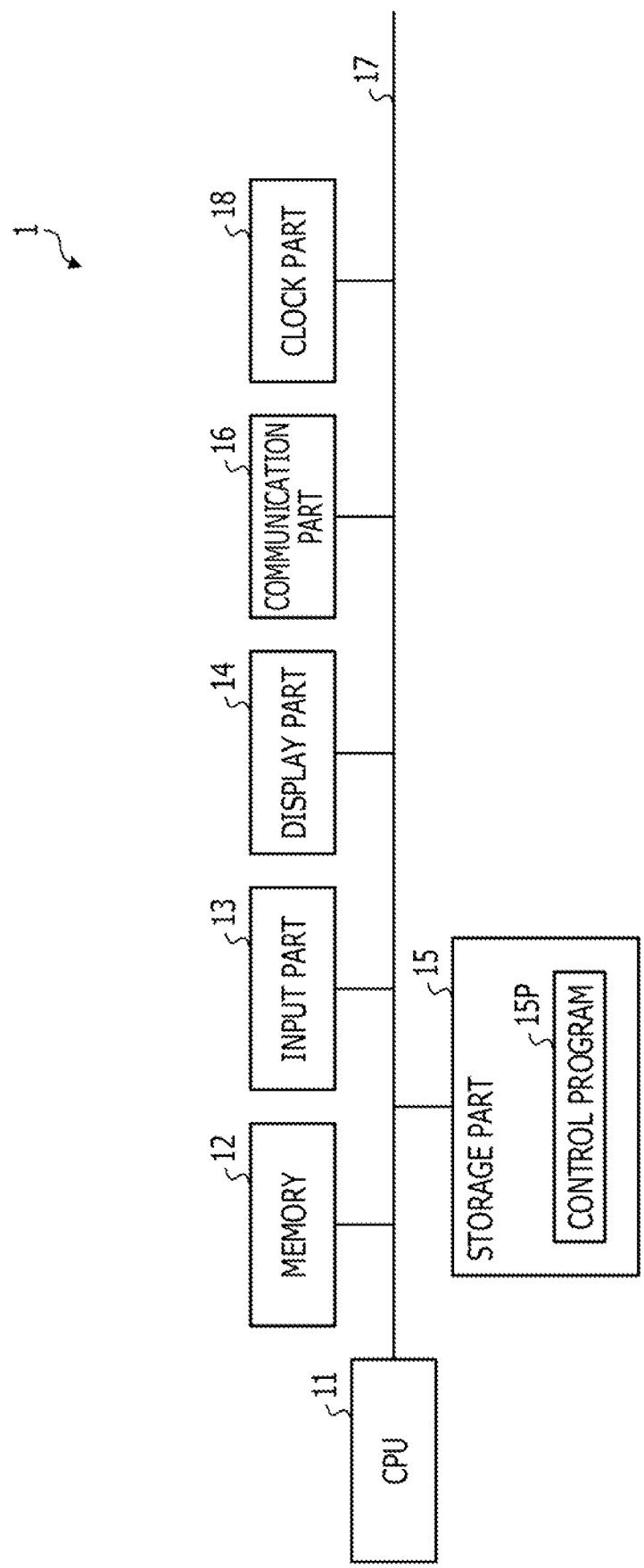
FIG. 2 is a block diagram illustrating a hardware group of a computer.

FIG. 2 is a block diagram illustrating a hardware group of the computer 1. The computer 1 includes a central processing unit (CPU) 11 as a control part, a memory 12, an input part 13, a display part 14, a storage part 15, a clock part 18, and a communication part 16.

The CPU 11 is connected to each of hardware components via a bus 17. The CPU 11 controls each of the hardware components in accordance with a control program 15P stored in the storage part 15. The CPU 11 may be a multicore processor equipped with a plurality of processor cores. Examples of the memory 12 include a static random access memory (SRAM), a dynamic RAM (DRAM), and a flash memory. The memory 12 temporarily stores various data generated at the time of execution of various programs by the CPU 11.

The input part 13 includes an input device such as a mouse, a keyboard, a touch panel, and a button, and outputs received operation information to the CPU 11. The display part 14 is a liquid crystal display, an organic electroluminescence (EL) display, or the like, and displays various types of information according to an instruction from the CPU 11.

The communication part 16 includes a communication module, and transmits and receives information to and from another computer (not illustrated) or the like. The clock part 18 outputs date and time information to the CPU 11. The storage part 15 is a large capacity memory or a hard disk, and stores the control program 15P or the like.

FIG. 3 is an explanatory diagram illustrating an address generation method. The CPU 11 obtains the first data in accordance with a predetermined operation rule. An example of the predetermined operation rule is an operation rule of a hash value based on a hash function. Hereinafter, the first data will also be referred to as a hash value. Although an example using a hash function is illustrated in the present embodiment, there is no limitation in operation. The first data may be obtained by operation using another function. The example of FIG. 3 illustrates an exemplary case where hash values 0, 1, 2, and 3 for character strings are calculated by hash operation. The character string field uses the form of character string X-Y, in which X indicates a hash value, and Y indicates an element ID of a set of character strings having a same hash value. For example, the character string 1-0 indicates a character string having a hash value of 1 among character strings, and a character string specified by ID=0 out of character string groups having the hash value of 1.

The CPU 11 generates a value obtained by adding file ID to the hash value of the character string, as an address. File IDs may be prepared up to the total number of addresses, for example, and it would be sufficient that any of the prepared addresses be assigned to the file every time the file becomes a compression processing target. When the prepared file IDs have been used up, all file IDs return to usable as soon as the dictionary is reset. For example, the CPU 11 assigns one address from among the total number of addresses prepared for the compression processing target file. The CPU 11 assigns all addresses to a plurality of files and performs processing, and thereafter resets the dictionary (memory 12). The CPU 11 once again assigns one address from among the total number of addresses prepared for the compression processing target file. In a case where the sum is the total number of file IDs (threshold) or more, the CPU 11 generates a value obtained by subtracting the total number of file IDs from the sum, as an address. It is also allowable to generate an address by using the following code, "Address= (hash value+file ID) % (total number of file IDs)". In the example of FIG. 3, in a case where the hash value is 0 and the file ID is 2, the address for writing is 2. In another case where the hash value is 3 and the file ID is 2, the sum is going to be 5. In this case, the total number of file IDs 4 is subtracted from the sum of 5, making the address for writing being 1. This is an example of processing of calculating an address from two arguments of a hash value and a file ID. Here, fixing the file ID to a certain value makes it bijective from a set of hash values to a set of addresses. Moreover, fixing a hash value to a certain value makes it bijective from a set of file IDs to a set of addresses.

Figure 4:
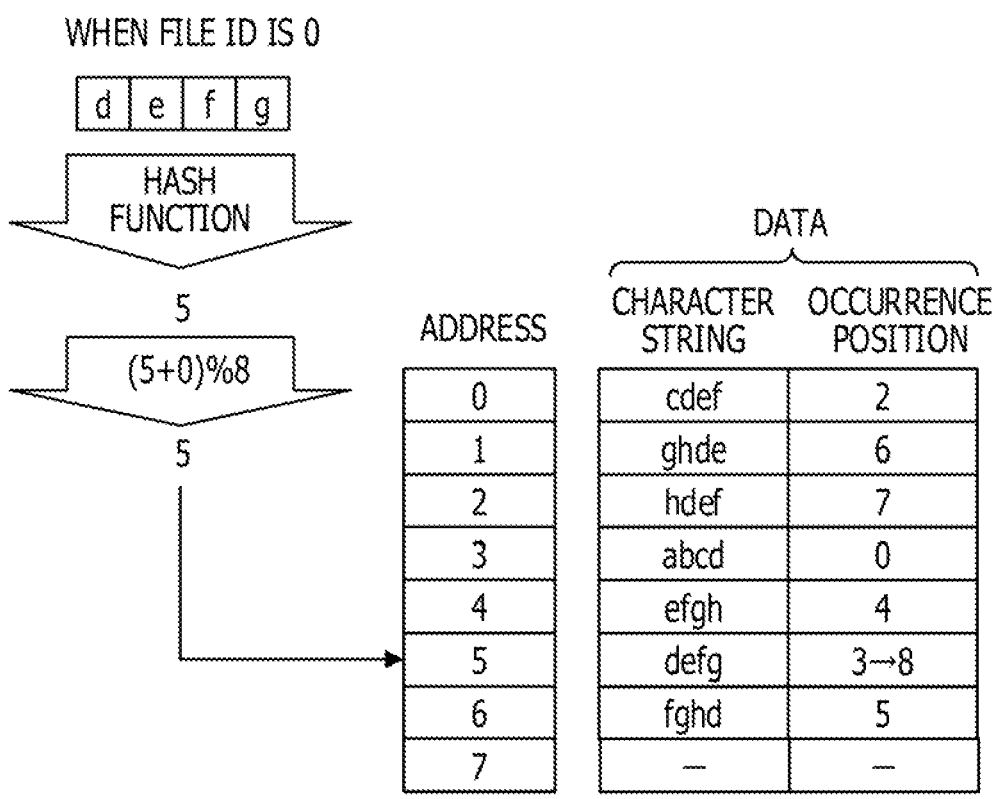
FIG. 4 is an explanatory diagram illustrating a data structure of a memory in a case where file ID is 0.

FIG. 4 is an explanatory diagram illustrating a data structure of the memory 12 in a case where file ID is 0. In a case where defg at the occurrence positions 8 to 12 out of the character string illustrated in FIG. 1 is to be stored in the memory 12, the CPU 11 calculates the hash value 5 using a hash function. Next, the CPU 11 adds the file ID 0 to the hash value to obtain 5. Here, since 5 is not the total number of file IDs 8 or more, overwriting with the occurrence position 8 of the leading character string is performed at the position of the address 5.

Figure 5:
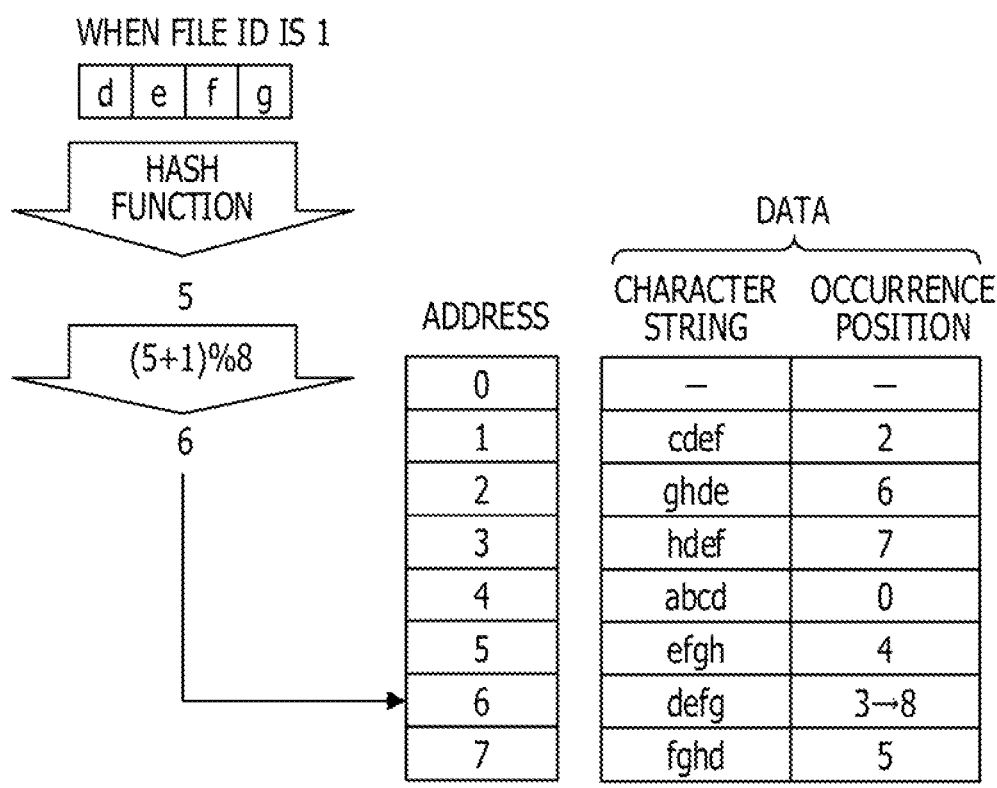
FIG. 5 is an explanatory diagram illustrating a data structure of a memory in a case where file ID is 1.

FIG. 5 is an explanatory diagram illustrating a data structure of the memory 12 in a case where the file ID is 1. In a case where defg at the occurrence positions 8 to 12 out of the character string illustrated in FIG. 1 is to be stored in the memory 12, the CPU 11 calculates the hash value 5 using a hash function. Next, the CPU 11 adds the file ID 1 to the hash value to obtain 6. Here, since 6 is not the total number of file IDs 8 or more, overwriting with the occurrence position 8 is performed at the position of the address 6. In another case, for example, where the hash value of the character string bcde is 7, addition of the file ID 1 makes the number 8, which is the total number of file IDs or more. Accordingly, CPU 11 performs subtraction of the total number of file IDs to obtain address 0. In this case, the character string bcdf is to be stored at address 0 where no data has been written, and the occurrence position 1 is to be stored.

Figure 6:
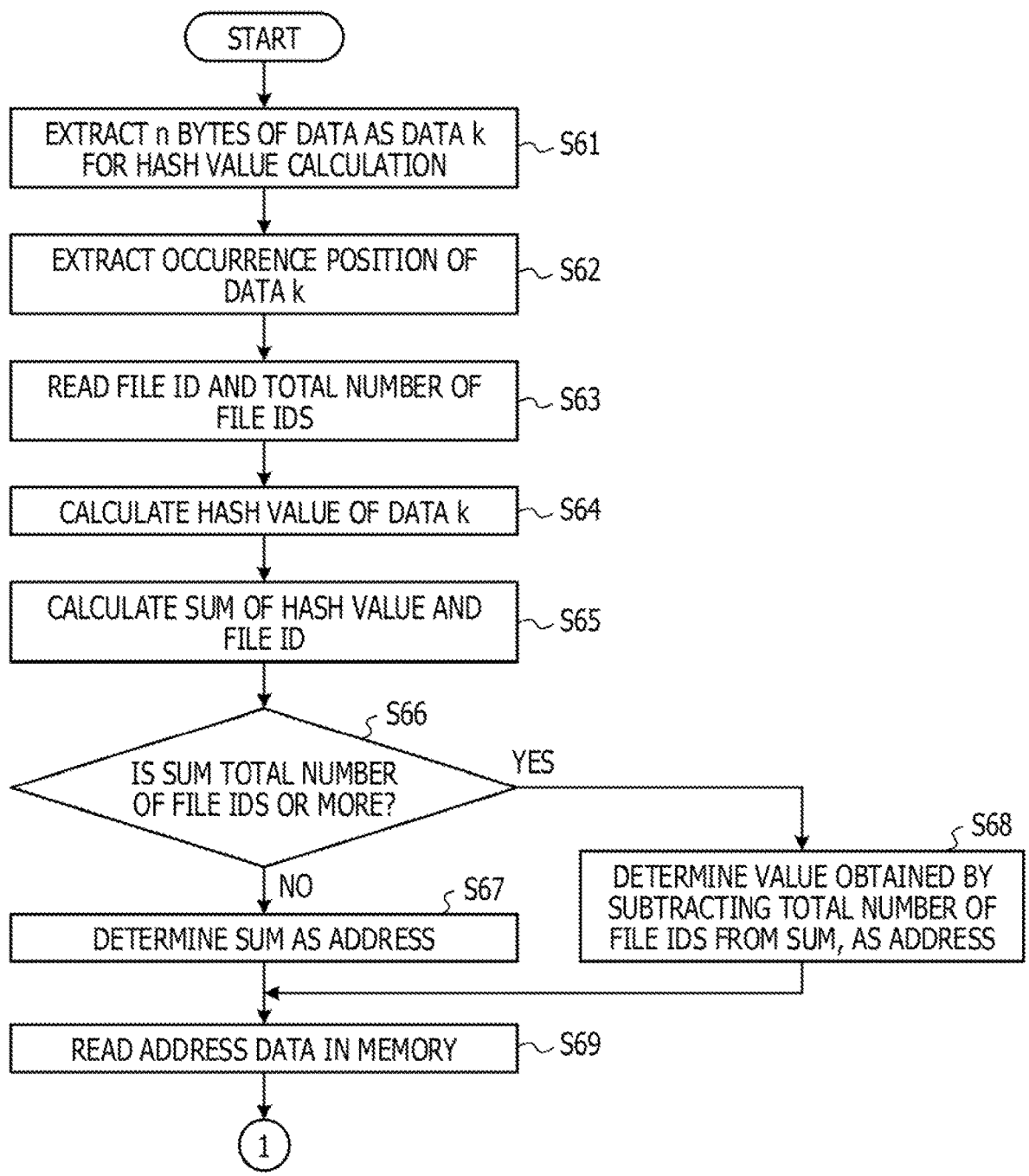
FIG. 6 is a flowchart illustrating a procedure of storage processing.
Figure 7:
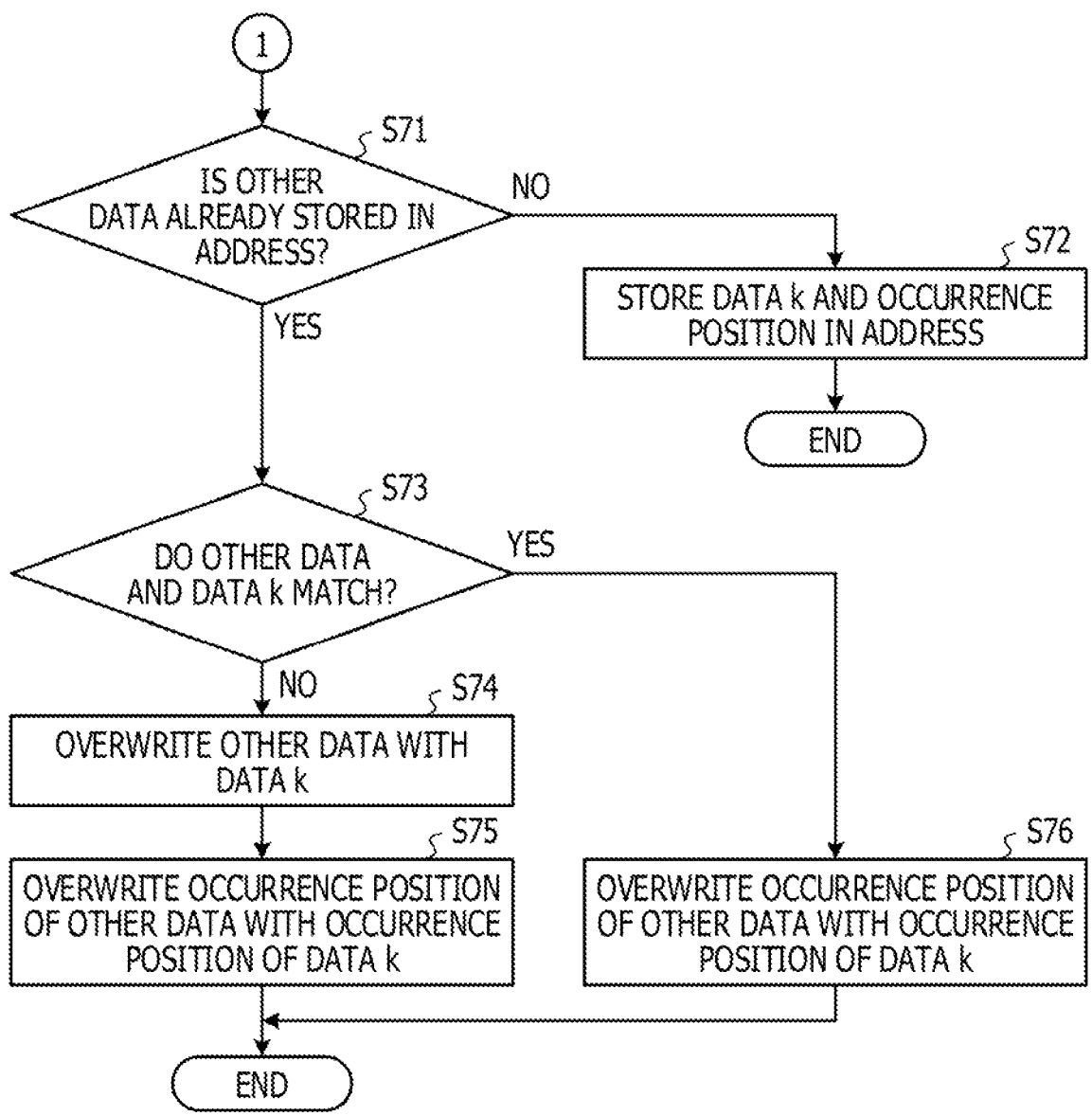
FIG. 7 is a flowchart illustrating a procedure of storage processing.

FIGS. 6 and 7 are flowcharts illustrating a procedure of storage processing. The CPU 11 extracts n bytes (4 bytes in the example of FIG. 5) of data as data k for hash value calculation (step S61).

For example, the n bytes at the head of the compression target data are set as the data k for hash value calculation. In the example of FIG. 5, the data k as target data is defg. The CPU 11 extracts an occurrence position of the data k (step S62). The occurrence position is a number assigned to each of pieces of data in order from the head of the data of the file. The CPU 11 reads file ID(s) and the total number of file IDs (step S63). In the example of FIG. 5, the occurrence position is 8, the file ID is 1, and the total number of file IDs is 8, and these numbers are treated as known numbers. The CPU 11 calculates a hash value of the data k (step S64).

The CPU 11 calculates the sum of the hash value and the file ID (step S65). In the example of FIG. 5, the hash value is 5, the file ID is 1, making the sum 6. The CPU 11 decides whether or not the sum is the total number of file IDs or more (step S66). In a case where the CPU 11 decides that the sum is not the total number of file IDs or more (NO in step S66), the CPU 11 controls the processing to proceed to step S67.

The CPU 11 determines the sum as an address (step S67). In a case where the CPU 11 decides that the sum is the total number of file IDs or more (YES in step S66), the CPU 11 controls the processing to proceed to step 568.

The CPU 11 determines a value obtained by subtracting the total number of file IDs from the sum, as an address (step S68). The CPU 11 reads the address data already stored in the memory 12 (step S69). The CPU 11 decides whether or not other data is already stored in the address (step S71). In a case where the CPU 11 decides that the data is not stored (NO in step S71), the CPU 11 controls the processing to proceed to step S72 on an assumption that data has not been stored after the memory 12 is reset.

The CPU 11 stores the data k in a character string storage region in the address of the memory 12 and stores an occurrence position in an occurrence position storage region (step S72). In a case where the CPU 11 decides that other data is already stored in the address (YES in step S71), the CPU 11 controls the processing to proceed to step S73. The CPU 11 decides whether or not the other data and the data k match (step S73). In a case where the CPU 11 decides that they do not match (NO in step S73), the CPU 11 controls the processing to proceed to step S74. The CPU 11 overwrites the other data in the character string storage region in the address of the memory 12 with the data k (step S74). The CPU 11 overwrites the occurrence position of the other data in the occurrence position storage region of the address of the memory 12 with the occurrence position of the data k (step S75).

In a case where the CPU 11 decides that the data k and the other data match (YES in step S73), the CPU 11 controls the processing to proceed to step S76. The CPU 11 overwrites the occurrence position of the other data in the occurrence position storage region of the address of the memory 12 with the occurrence position of the data k (step S76). The embodiment performs processing of omitting the overwriting with the matched data k in the character string storage region in the processing of step S76. It is allowable, however, to perform overwriting with the data k in a same manner as in step S74.

The processing described above makes it possible to suppress circuit scale expansion. In a case where the file and the hash value are the same, the addresses would become the same, and this enables execution of character string comparison determination processing in compression processing. In a case where the files are the same but the hash values are different, the address would be different. Accordingly, the processing would not shift to the character string comparison determination processing. In a case where the files are different but the hash values are the same, the address is different. Accordingly, the processing does not shift to the character string comparison determination processing. In a case where the flies are different and the hash values are different, it is possible to decide that the files are different when there is a difference in matching results up to the character string length used for hash value calculation. The address is obtained by subtracting the total number of file IDs in a case where the sum is the total number of file IDs or more, leading to reduction of the memory amount.

Second Embodiment

Figure 8:
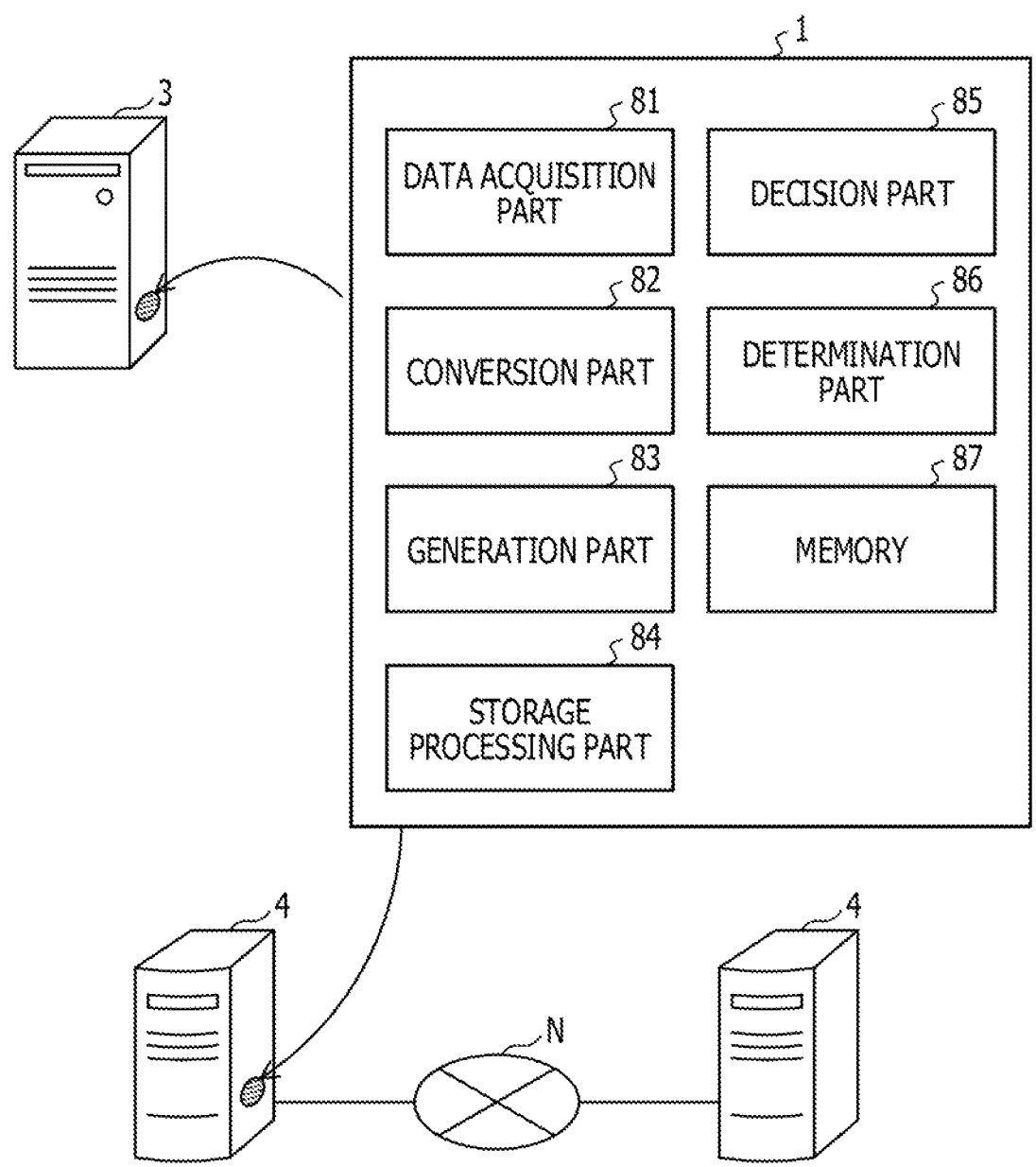
FIG. 8 is a block diagram illustrating a hardware group of an information processing device according to a second embodiment.

A second embodiment relates to a mode implemented by hardware. FIG. 8 is a block diagram illustrating a hardware group of an information processing device 1 according to the second embodiment. The second embodiment will describe an example in which the functions described in the first embodiment are implemented in an FPGA. The information processing device 1 includes a data acquisition part 81, a conversion part 82, a generation part 83, a storage processing part 84, a decision part 85, a determination part 86, each of which implemented as logic circuits, and a memory 87. The information processing device 1 such as an FPGA may be implemented as a data compression device in a server computer 3 of a data center that processes a large amount of data, for example. The information processing device 1 is also applicable as a device implemented as a data compression device in a communication device 4 that transmits and receives a large amount of information or as a device connected to the communication device 4. Hereinafter, processing performed by individual circuits will be described in detail.

The data acquisition part 81 obtains n bytes of compression target data related to the file ID, as data k for hash value calculation.

The conversion part 82 obtains a hash value of the data k and converts the data k into a hash value. The generation part 83 calculates a sum of the hash value calculated by the conversion part 82 and the file ID. The generation part 83 also decides whether or not the sum is the total number of file IDs or more. In a case where the generation part 83 decides that the sum is not the total number of file IDs or more, the generation part 83 generates the sum as an address. In contrast, in a case where the generation part 83 decides that the sum is the total number of file IDs or more, the generation part 83 generates a value obtained by subtracting the total number of file IDs from the sum, as an address.

The decision part 85 reads data of the address generated by the memory 87. The decision part 85 decides whether or not other data is already stored in the address. When a signal indicating that other data is not stored has been received by the decision part 85, the storage processing part 84 stores the data k and the occurrence position of the data k in the character string storage region and the occurrence position storage region of the address of the memory 87. In a case where a signal indicating that other data is already stored in the address has been received by the decision part 85, the determination part 86 determines whether or not the other data and data k match. In a case where a signal determined to be non-matching by the determination part 86 has been received, the storage processing part 84 overwrites other data with the data k in the address of the memory 87.

Also, the storage processing part 84 overwrites the occurrence position of the other data in the address of the memory 87 with the occurrence position of the data k. In a case where a signal determined to be matching by the determination part 86 has been received, the storage processing part 84 overwrites the occurrence position of the other data with the occurrence position of the data k in the address of the memory 87. The memory 87 described above has a data structure as follows. Target data is stored in a character string storage region (first region) corresponding to the address of the memory 87. Furthermore, the occurrence position of the target data is stored in an occurrence position storage region (second region) corresponding to the address of the memory 87, With this configuration, it is possible to reduce the circuit scale as compared with a system of adding the memory 87 for each of files. In addition, it is possible to reduce the expansion of circuit scale as compared with a system of newly providing the memory 87 with a region corresponding to the file ID.

Figure 9:
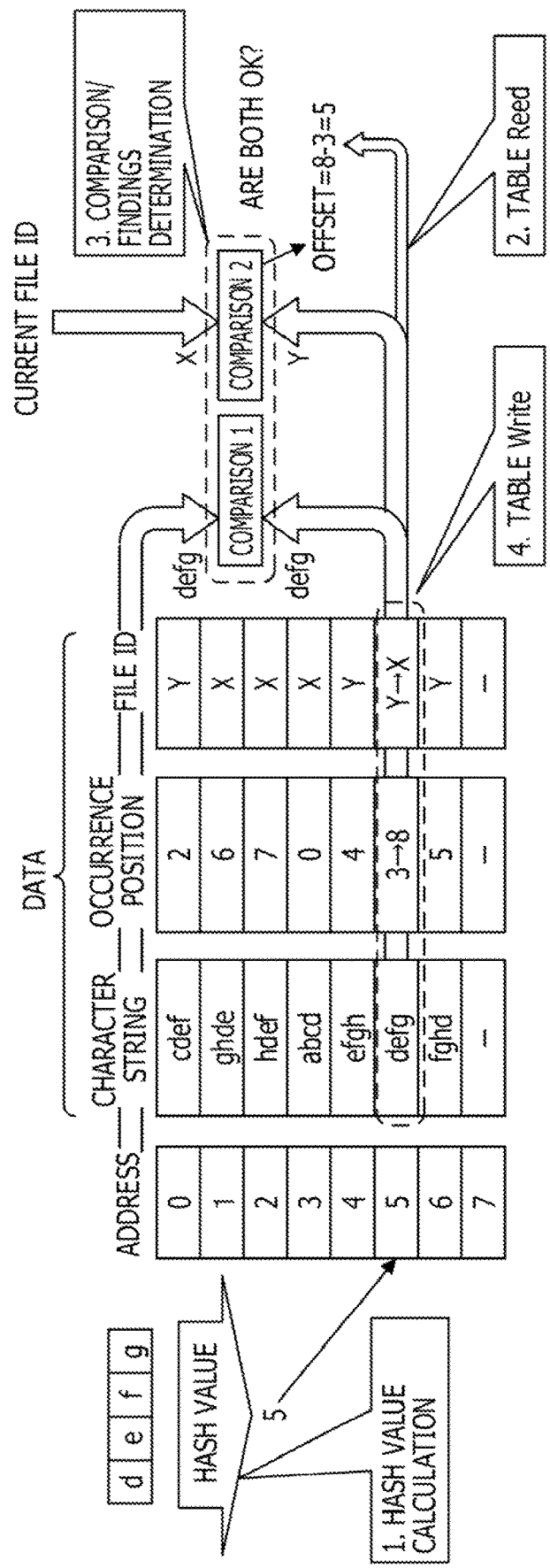
FIG. 9 is an explanatory diagram illustrating a storage system of a comparative example.

FIG. 9 is an explanatory diagram illustrating a storage system according to a comparative example. The system according to the comparative example adds a region for storing the file ID to the memory 87. FIG. 9 illustrates an example of compressing a character string defg with file ID X. First, a hash value 5 is calculated. Subsequently, overwriting with the occurrence position and the file ID is performed in an address 5 corresponding to the hash value 5. In this case, a record Y of the file ID in the memory 87 is to be overwritten with X. In contrast, the embodiment makes it possible to perform compression without increasing the bit width corresponding to the file ID of the memory 87 as illustrated in the comparative example. This would enable expansion of reset intervals of the memory 12 without adding a circuit for storing information.

The second embodiment is as described above. Other parts are similar to the first embodiment, and thus, corresponding portions are denoted by the same reference numerals and detailed description will be omitted.

Third Embodiment

Figure 10:
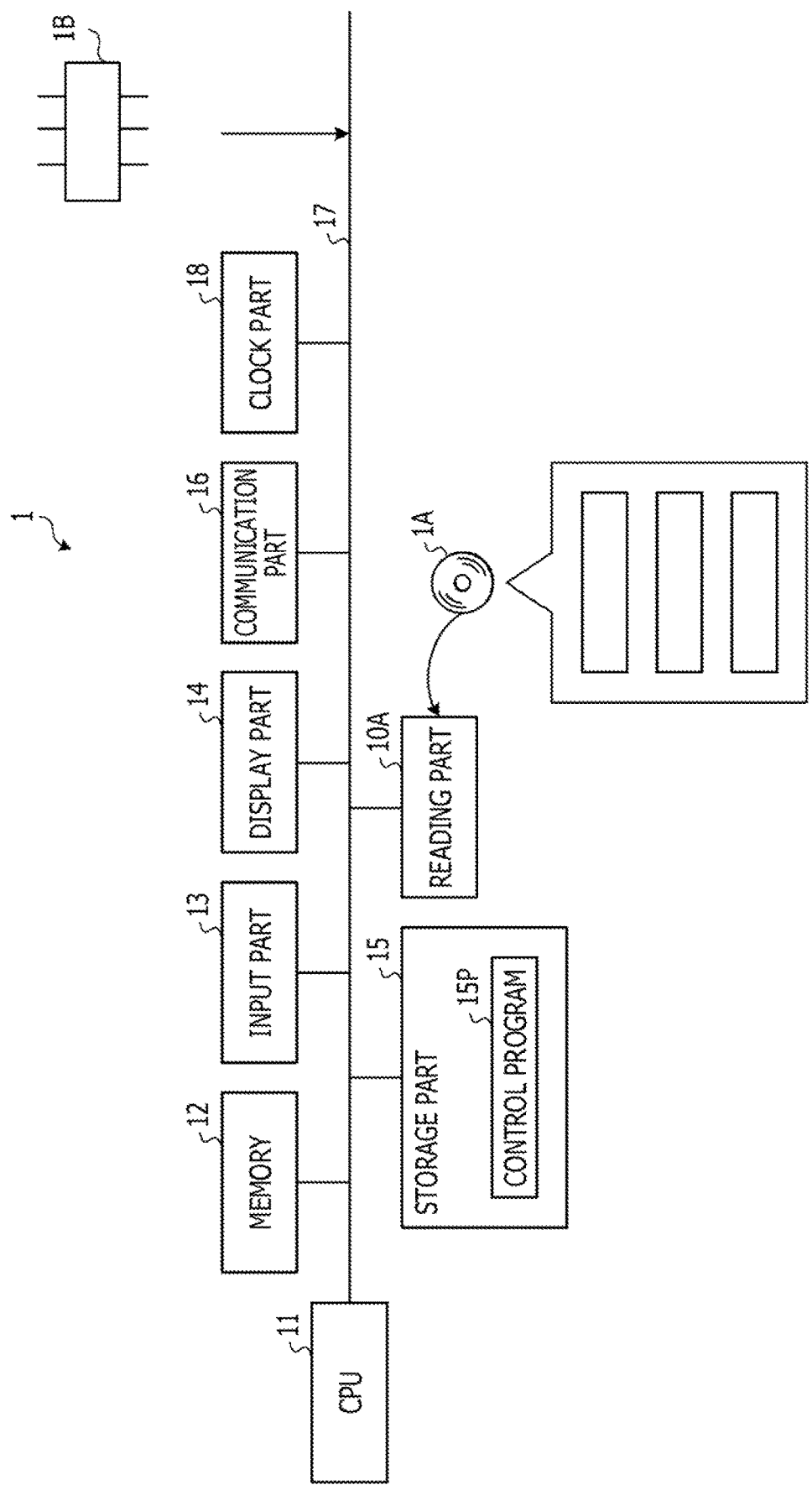
FIG. 10 is a block diagram illustrating a hardware group of a computer according to a third embodiment.

FIG. 10 is a block diagram illustrating a hardware group of a computer 1 according to a third embodiment. A program for operating the computer 1 may cause a reading part 10A such as a disk drive and a memory card slot to read a portable recording medium 1A such as a CD-ROM, a DVD disk, a memory card or a USB memory so as to be stored in the storage part 15. It is also allowable to mount, on the computer 1, a semiconductor memory 1B such as a flash memory storing the program. The program may also be downloaded from another server computer (not illustrated) connected via a communication network N such as the Internet. The details will be described below.

The computer 1 illustrated in FIG. 10 reads a program for executing the various software processing described above from the portable recording medium 1A or the semiconductor memory 1B, or downloads the program from another server computer (not illustrated) via the communication network N. The program is installed as a control program 15P, loaded to the memory 12 and executed. This configuration makes it possible to achieve functions as the computer 1 described above.

The third embodiment is as described above. Other parts are similar to the first and second embodiments, and thus, corresponding portions are denoted by the same reference numerals and detailed description will be omitted. The embodiments described above may be combined with each other.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An information processing device comprising:
a memory; and
a processor coupled to the memory and configured to:
convert target data into first data by predetermined arithmetic processing;
generate second data based on the converted first data and identification information which specifies a file of the target data;
store the target data in an address of a memory corresponding to the generated second data;
decide whether other target data is stored in the address;
determine whether the target data matches the other target data when deciding that the other target data is stored;
overwrite, when determining that the data do not match, the other target data with the target data in the address; and
overwrite the position information of the other target data with the position information of the target data.

2. The information processing device according to claim 1, wherein the processor is configured to add the first data and the identification information to generate the second data.

3. The information processing device according to claim 1, wherein the processor is configured to, in a case where a sum obtained by adding the first data and the identification information is a threshold or more, subtract the threshold from the sum to generate the second data.

4. The information processing device according to claim 1, wherein the processor is configured to store, when deciding that the other target data is not stored, in the address, the target data and position information that specifies a position of the target data in the file.

5. The information processing device according to claim 4, wherein the processor is configured to, when deciding that the data match, overwrite the position information of the other target data with the position information of the target data in the address.

6. An information processing method comprising:
converting, by a computer, target data into first data by predetermined arithmetic processing;
generating second data based on the converted first data and identification information which specifies a file of the target data;
storing the target data in an address of a memory corresponding to the generated second data;
deciding whether other target data is stored in the address;
determining whether the target data matches the other target data when deciding that the other target data is stored;
overwriting, when determining that the data do not match, the other target data with the target data in the address; and
overwriting the position information of the other target data with the position information of the target data.

7. The information processing method according to claim 6, further comprising adding the first data and the identification information to generate the second data.

8. The information processing method according to claim 6, further comprising in a case where a sum obtained by adding the first data and the identification information is a threshold or more, subtracting the threshold from the sum to generate the second data.

9. The information processing method according to claim 6, further comprising storing, when deciding that the other target data is not stored, in the address, the target data and position information that specifies a position of the target data in the file.

10. The information processing method according to claim 6, further comprising when deciding that the data match, overwriting the position information of the other target data with the position information of the target data in the address.

11. A data structure storing target data in a first region corresponding to an address of a memory,
the target data is stored in the first region of the address corresponding to a second data by processing including: converting the target data into first data by predetermined arithmetic processing, and generating the second data on a basis of the converted first data and identification information which specifies a file of the target data,
by deciding whether other target data is stored in the address and determining whether the target data matches the other target data when deciding that the other target data is stored, the other target data is overwritten with the target data in the address when determining that the data do not match and the position information of the other target data is overwritten with the position information of the target data.

\* \* \* \* \*